United States Patent [19]

Akimoto et al.

[11] 4,104,549

[45] Aug. 1, 1978

[54] MAGNETITE FERRITE FOR MAGNETOSTRICTIVE VIBRATORS

[75] Inventors: Yumi Akimoto; Tamotsu Ishii, both of Omiya; Motohiko Yoshizumi, Urawa; Sadaaki Haghino, Omiya, all of Japan

[73] Assignee: Mitsubishi Kinzoku Kabushiki Kaisha, Japan

[21] Appl. No.: 680,669

[22] Filed: Apr. 27, 1976

Related U.S. Application Data

[63] Continuation-in-part of Ser. No. 484,883, Jul. 1, 1974, abandoned.

[30] Foreign Application Priority Data

| Jul. 3, 1973 | [JP] | Japan | 48-74415 |
| Jul. 7, 1973 | [JP] | Japan | 48-76131 |
| Jul. 7, 1973 | [JP] | Japan | 48-76133 |
| Jul. 7, 1973 | [JP] | Japan | 48-76134 |
| Jan. 28, 1974 | [JP] | Japan | 49-10982 |
| Feb. 4, 1974 | [JP] | Japan | 49-13760 |
| Apr. 10, 1974 | [JP] | Japan | 49-39820 |
| Apr. 15, 1974 | [JP] | Japan | 49-41875 |
| Jul. 3, 1974 | [GB] | United Kingdom | 29453/74 |
| Jul. 2, 1974 | [DE] | Fed. Rep. of Germany | 2431698 |
| Jul. 2, 1974 | [NL] | Netherlands | 7408914 |
| Jul. 3, 1974 | [FR] | France | 74 23131 |

[51] Int. Cl.$^2$ .................................... H01L 41/06
[52] U.S. Cl. ............................. 310/26; 252/62.55
[58] Field of Search ........................ 310/26; 340/11; 252/62.55, 62.56, 62.59, 62.63, 62.58; 423/633

[56] References Cited

U.S. PATENT DOCUMENTS

| 2,925,388 | 2/1960 | Harvey | 252/62.55 |
| 2,930,912 | 3/1960 | Miller | 310/26 |
| 2,947,889 | 8/1960 | Rich | 310/26 |
| 3,147,392 | 9/1964 | Stark | 310/26 |
| 3,271,316 | 9/1966 | Inove et al. | 252/62.55 |
| 3,375,195 | 3/1968 | Brockman et al. | 310/26 X |

Primary Examiner—Mark O. Budd
Attorney, Agent, or Firm—Robert E. Burns; Emmanuel J. Lobato; Bruce L. Adams

[57] ABSTRACT

A method for generating magnetostrictive vibration which comprises:
  providing a vibrator element comprising a sintered structure of magnetite having an oxygen/iron (O/Fe) atomic ratio within the range of 4.0/3 to 4.1/3, a specific resistance of not lower than 0.1 ohm cm, and a positive static magnetostriction and containing in its sintered state at least one additive element selected from the group consisting of cobalt, calcium, titanium, silicon, boron, and sodium; and
  applying an alternative magnetic field to the vibrator element.

There is also provided an improved magnetostrictive vibrator element for use in the above method, which comprises:
  the above-mentioned sintered structure, and
  fixing means for applying a compressing force of 30 to 1800 Kg/cm$^2$ to opposite ends of the sintered structure in the direction of the principal vibration thereof.

8 Claims, 22 Drawing Figures

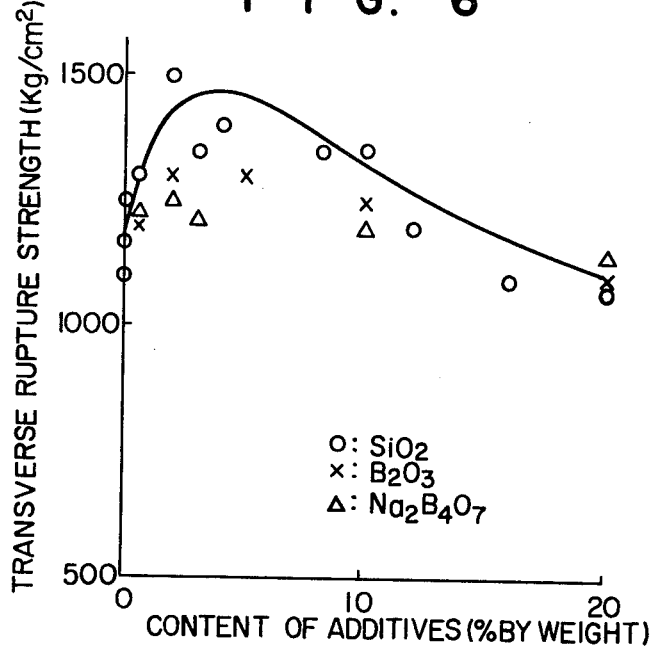
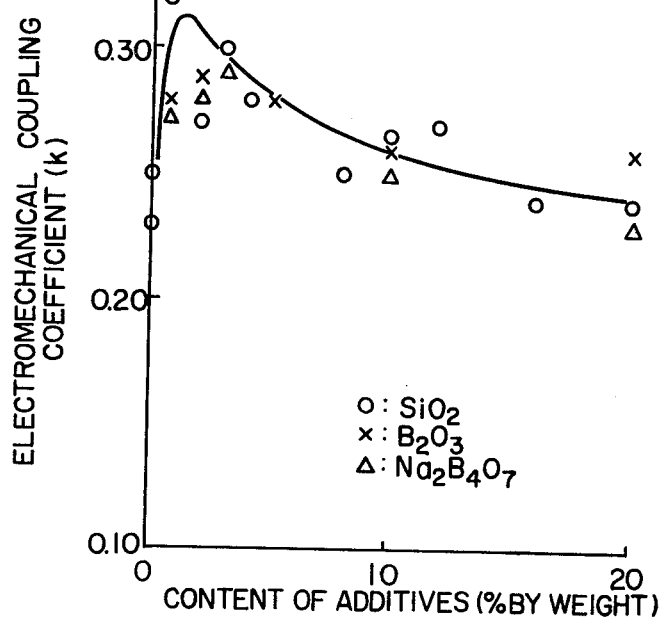

MAGNETITE FERRITE FOR MAGNETOSTRICTIVE VIBRATORS

CROSS REFERENCE TO RELATED APPLICATIONS

This application is a continuation-in-part of application Ser. No. 484,883 filed Jul. 1, 1974 and now abandoned.

BACKGROUND OF THE INVENTION

This invention relates generally to a method for generating magnetostrictive vibration by using a novel composition of a magnetostrictive element comprising sintered cobalt-containing magnetite, and a magnetostrictive vibrator for use therein.

In general, ferrites for magnetostrictive vibrators have the advantageous feature of higher electrical resistance at frequencies in the ultrasonic region and, therefore, less eddy current loss, in comparison with metal magnetostrictive vibrators. For this reason, ferrites have been widely used as vibrators of ultrasonic equipment, the principal examples of which are ultrasonic washing machines and ultrasonic fabricating machines and tools.

The ferrites used at present for magnetostrictive vibrators are all materials having Ni ferrite (more exactly, which further contain Cu, Co and so on as minor components but hereinafter are referred to merely as Ni ferrite) as their principal constituent, but these materials are of complicated composition and are accompanied by the problem of high production cost due to high cost of the starting materials.

Furthermore, a Ni ferrite used for magnetostrictive vibrators is disadvantageous in that the absolute value of the saturated static magnetostriction thereof is not very great, whereby a vibrator produced therefrom does not necessarily possess ample performance as a powerful ultrasonic vibrator. Furthermore, the utilization thereof is restricted by its negative static magnetostriction.

On one hand, magnetites have been known as exhibiting magnetostrictive property, and attempts have been made to use sintered magnetites as magnetostrictive vibrators. However, these materials are not being used at present because of certain difficulties, the principal examples of which are as follows.

1. A product of sufficiently high density as a sintered material cannot be obtained, and for this reason, mechanical strength required for continuous magnetostrictive vibration cannot be acquired by the product.

2. The electrical resistance of a magnetite is of the order of $10^{-2}$ ohm-cm., which is substantially low for a ferrite, and the eddy current loss thereof cannot be therefore neglected.

As a result of our studies for overcoming the above described difficulties, we have previously developed a method for producing a magnetite of improved magnetostrictive properties which can be adapted for use in the production of magnetostrictive vibrators. The method comprises correctly regulating the starting iron-oxide material and strictly controlling the sintering conditions (as disclosed in U.S. patent application Ser. No. 484,869 entitled "Production of Ferrite for Magnetostrictive Vibrators" filed Mar. 6, 1976, by Yumi AKIMOTO et al.).

SUMMARY OF THE INVENTION

An object of the present invention, which is related to the above cited invention, is to provide a method for generating magnetostrictive vibration, which is characterized by the use of a magnetostrictive vibrating element made of a sintered magnetite ferrite whose magnetostrictive properties are improved by the addition of specific additives.

Another object of the invention is to provide an improved magnetostrictive vibrator which utilizes a specific property, namely positive magnetostriction, of the sintered magnetite ferrite.

According to the invention in a general aspect thereof, there is provided a method for generating magnetostrictive vibration which comprises:

providing a vibrator element comprising a sintered structure of magnetite having an oxygen/iron (O/Fe) atomic ratio within the range of 4.0/3 to 4.1/3, a specific resistance of not lower than 0.1 ohm.cm, and a positive static magnetostriction and containing in its sintered state at least one additive element selected from the group consisting of cobalt, calcium, titanium, silicon, boron, and sodium; and applying an alternative magnetic field to the vibrator element.

According to the invention in another aspect thereof, there is provided a magnetostrictive vibrator element which comprises:

a magnetostrictive element of a sintered structure of magnetite having an oxygen/iron atomic ratio within the range of 4.0/3 to 4.1/3, a specific resistance of not lower than 0.1 ohm.cm, and a positive magnetostriction and containing in its sintered state at least one additive element selected from the group consisting of cobalt, calcium, titanium, silicon, boron, and sodium; and fixing means for applying a compressing force of 30 to 1,800 kg/cm$^2$ to opposite ends of the magnetostrictive element in the direction of the principal vibration thereof.

The nature, principle, and utility of the present invention will be more fully understood from the following detailed description of the invention when read in conjunction with the accompanying drawings.

BRIEF DESCRIPTION OF THE DRAWINGS

In the drawings:

FIG. 6 is a graph indicating variation of transverse rupture strength of still another example of a magnetite ferrite containing additives such as $SiO_2$, $B_2O_3$, and $Na_2B_4O_7$ with the contents of these additives;

FIG. 7 is a graph indicating variation of electromagnetic coupling coefficient of the same example of ferrite with the contents of the above mentioned additives.

DETAILED DESCRIPTION

A magnetite has a saturated magnetostriction greater than $+35 \times 10^{-6}$ the absolute value of which is far greater than that of Ni-Cu ferrites of the order of $-26 \times 10^{-6}$. However, when a magnetite is to be used for a magnetostriction vibrator, various properties thereof must be further improved.

That is, (a) the electric resistance thereof should be elevated so that the specific resistance exceeds at least 0.1 ohm cm, or preferably 20 ohm.cm; (b) the saturated magnetostriction should be elevated in excess of the above stated value; (c) the electromechanical coupling coefficient of the magnetite should be further elevated; and (d) the mechanical strength thereof should also be improved.

Our observation was directed toward the sintering of magnetites, and, as a result of our research and study from various angles, the following facts were verified.

1. In general, a magnetite at a high temperature is in the form of a non-stoichiometric compound $Fe_3O_{4+x}$ (where $0 \leq x < 0.1$) and has a composition which is varied in a wider range than that at a low temperature. However, when a magnetite in this form of $Fe_3O_{4+x}$ which has been sintered at a sintering temperature of from 1,000 to 1,400° C is caused to cool to a low temperature, it assumes either a structure wherein fine particles of $Fe_2O_3$ are dispersed in a $Fe_3O_4$ matrix, or a single phase structure consisting of quenched $Fe_3O_{4+x}$.

2. The specific resistance and mechanical properties of a magnetite in the form of $Fe_3O_{4+x}$ (wherein $0 \leq x < 0.1$, or preferably $0 < x < 0.1$) are extremely high. Accordingly, when the nonstoichiometric compound is used as a ferrite for a magnetostriction vibrator, the electric resistance and the mechanical properties of the magnetostriction vibrator can be substantially improved.

Figure 8:
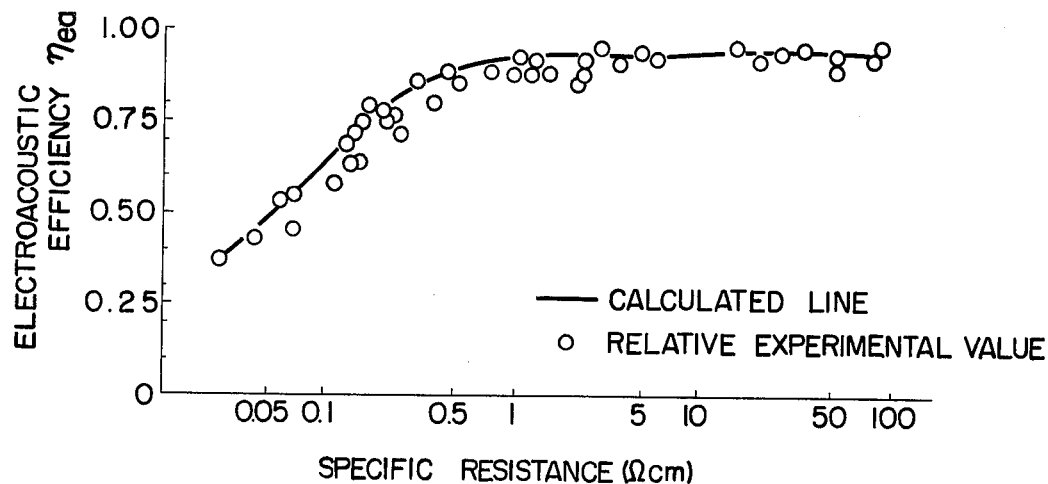
FIG. 8 is a graph representing the variations of the relative experimental value and the calculated value of electroacoustic conversion efficiency of a magnetite ferrite vibrator to be used at 28 KHz with the variation in its specific resistance.

In order to show how the electroacoustic efficency ηea (Pa/Pi wherein Pi is electric input power and Pa is actual acoustic power emitted from the transmitter) representing the efficiency of a magnetostrictive vibrator depends on the electrical resistance, the relationship between calculated ηea values and relative experimental ηea values is indicated in FIG. 8 where the theoretical calculation is based on Y. Kikuchi "Ultrasonic Transmitters", Corona Publishing Co., Tokyo, pp. 268–293 (1969).

Since the quantity which can be measured experimentally with respect to ηea is a quality factor Q proportional thereto, the experimental Q value at a specific resistance of 100 ohm cm. which is close to the saturated value was assumed to be equal to the calculated ηea value at said specific resistance and, at the other specific resistances. ηea was calculated in proportion to the experimental Q value and the ηea thus obtained was assumed as relative experimental value. While the experimental values shown in FIG. 8 were obtained with respect to π-shaped magnetite vibrator for 28 KHz prepared with varied compositions, it has been confirmed that substantially no variations are observed in the tendency with respect to vibrators for 15–100 KHz.

As illustrated in FIG. 8, when the specific resistance of a magnetostrictive vibrator is higher than 0.1 ohm cm., the electroacoustic efficiency thereof becomes more than 60%, and, when the specific resistance is higher than 0.5 ohm cm., the electroacoustic efficiency becomes more than 90%. The samples having a specific resistance of higher than 30 ohm cm. are increased in the specific resistance by the addition of titanium to magnetite.

Furthermore, it has been found preferable that the average diameter of grains of crystals in the sintered magnetite be within the range of from 0.7 to 50 μ and the density of the sintered magnetite be not less than 90%, preferably 95%, of the theoretical density of the magnetite crystal (= 5.20g/cm$^3$). By satisfying these conditions, the mechanical properties of the sintered magnetite, particularly the transverse rupture strength thereof can be improved. Sintered magnetite having a desirable crystalline grain size and density can be obtained by suitably selecting the particle size of the starting iron oxide selected from the group consisting of magnetite, ferric oxide, and mixtures thereof (0.02 to 5.0 μ), the partial pressure of oxygen in the sintering atmosphere, and the sintering temperature (from 1,000° to 1,400° C).

With the above described facts in view, a process for producing sintered magnetite ferrite of characteristics particularly adapted for a magnetosrictive vibrator has been developed by the inventors of this application. This process comprises: sintering a preformed structure formed from starting powder selected from the group consisting of magnetite and a mixture of magnetite and ferric oxide and having an average particle size $d(\mu)$ in the range of $0.02 \leq d \leq 5.0$, said preformed structure having a size corresponding to a resonance frequency $f$ (KHz) of from 15 to 100KHz as a magnetostrictive vibrator, in an atmosphere wherein the partial pressure of oxygen is from $10^{-1}$ to $10^{-11}$ atmosphere at a temperature T(° C) which will meet the following requirements:

$$1,000 \leq T \leq 1,350$$

and $$160 \log_{10}d + 1,180 \leq T \leq 140 \log_{10}d + 1,305$$

and thereafter cooling the structure at a cooling rate $m$ (° C/min.) which will meet the requirement:

$$m < 0.5 f$$

thereby to produce a macroscopically homogeneous sintered ferrite structure having an oxygen/iron (O/Fe) atomic ratio of 4.0/3 < O/Fe < 4.1/3, a resonance frequency f(KHz) of from 15 to 100 KHz, a density of at least 90% of the theoretical density and an average grain size of from 0.7 to 50 μ.

A patent application for the above described process for producing sintered magnetite ferrite has been filed by Yumi AKIMOTO et al under the title of "Production of Ferrite for Magnetostrictive Vibrators" (U.S. patent application Ser. No. 484,869 filed on Mar. 6, 1976). The contents of the above application relate to the production of magnetite ferrite which is also advantageous in the execution of this invention, and are incorporated herein by reference.

Whereas the sintered magnetite thus obtained has properties well adapted for the production of the magnetostrictive vibrators, we have found that the properties of sintered magnetic ferrite to which small amounts of specific elements selected from cobalt, calcium, titanium, silicon, boron, and sodium have been further added are remarkably improved in magnetostrictive properties, particularly in static magnetostriction, electroacoustic coupling coefficient, and electric resistance, and also in mechanical properties including mechanical strength, all of these properties being essential for the provision of highly improved magnetostrictive vibrators.

The advantageous features or effects of the addition of the above enumerated additives will be apparent from the following descriptions of examples which are by no means of limitative nature with respect to the scope of this invention. In all Examples, the O/Fe ratio, transverse rupture strength, electromechanical coupling coefficient, specific resistance, and saturated magnetostriction were measured in the following manner.

O/Fe ratio: $Fe^{2+}$ and $Fe^{3+}$ in samples were calculated as follows. In the calculation all of the anions to be coupled with $Fe^{2+}$ and $Fe^{3+}$ were assumed to be $O^{2-}$. This assumption was based on the fact that there were no other anions to be coupled with $Fe^{2+}$ and $Fe^{3+}$ in view of the sintering condition. When a magnetite containing a metal element or elements other than iron is considered, oxygen coupled with these metal elements other than iron is not taken into account. The total amount of iron ions contained in the sample was measured by dissolving iron oxides in the sample in aqueous hydrochloric acid solution, treating the solution with Sn Cl$_2$ thereby converting the total iron content into $Fe^{2+}$, and titrating the $Fe^{2+}$ by oxidizing the ions in an aqueous solution of potassium per manganate. The original content of $Fe^{2+}$ was measured by first dissolving the iron oxides in the sample completely into an aqueous hydrochloric acid solution while carbon dioxide gas was blown into the solution in order to avoid the oxidation of $Fe^{2+}$, and the $Fe^{2+}$ in the solution was titrated by an aqueous solution of potassium permanganate. The original content of $Fe^{3+}$ was obtained by subtracting the $Fe^{2+}$ content from the total amount of iron ions.

Transverse rupture strength:

This strength was measured by a conventional method. Electromechanical coupling coefficient:

This coefficient was calculated from the results of tests carried out on bar-shaped samples (compensation for demagnetizing field being required) and ring-formed samples by the use of a vector impedance meter.

Specific resistance:

Specific resistance was measured by the conventional four-probe method.

Maximum value of static magnetostriction:

This was measured by means of a strain gauge at a magnetic field strength of more than 500 oersted.

Sintered magnetite ferrites wherein substantially none of the above described additives are contained are described in Examples 1 and 2.

EXAMPLE 1

0.5% by weight of polyvinyl alcohol was mixed with the remainder percentage of a magnetite powder, and the resulting mixture was formed under application of a pressure of 15 tons/cm$^2$ in cold state into bar-shaped samples each measuring 100 × 12 × 12 mm. These samples were then placed in a stream of pure carbon dioxide gas in a furnace, the temperature of the samples being raised at a rate of 300° C/min to 1,050° C, and the samples were sintered at this temperature for 12 hours. The samples were then cooled in the furnace to the ambient temperature. The resulting bars of sintered magnetite exhibited a density equal to 95.5% of the theoretical value of 5.20 g/cm$^3$; a composition of Fe$_3$O$_{4.04}$; and a specific resistance of 31 ohm cm. The transverse rupture strength of the bars was 1,080 kg/cm$^2$, and the electromechanical coupling coefficient thereof was 0.28. After continuous oscillation for 24 hours of the magnetostrictive bars with an electric input of 40 watt/cm², the electromechanical coupling coefficient was found to have undergone no recognizable variation.

EXAMPLE 2

0.5% by weight of polyvinyl alcohol and 0.5% by weight of zinc stearate were mixed with the remainder percentage of a magnetite powder, and the resulting mixture was processed under the same conditions as described in Example 1, thereby producing bar-shaped samples. The samples were then placed in a stream of pure carbon dioxide gas in a furnace, the temperature thereof being raised at a constant rate of 300° C/min. to 1,350° C. The stream of carbon dioxide gas was then changed to that of carbon dioxide gas containing 10% by volume of oxygen, and the samples were sintered in the stream of this mixed gas at 1,350° C for 6 hours. After completion of the sintering process, the gas was again changed from the mixed gas to the pure carbon dioxide, and the sintered products were cooled in the oven to the ambient temperature. The products thus obtained exhibited a density equal to 97.8% of the theoretical value; a composition of $Fe_3O_{4.005}$; a specific resistance of 18 Ωcm; a transverse rupture strength of 1,220 kg/cm²; and an electromechanical coupling coefficient of 0.31.

From the above described two examples, it is apparent that ferrites for magnetostrictive vibrator having extremely high mechanical strength and elevated electrical properties can be obtained by the simple procedure of sintering magnetite in an atmosphere of pure carbon dioxide gas or of oxygen-containing carbon dioxide gas.

Next, an addition of a small amount of cobalt into the magnetite, which constitutes an important feature of the present invention will now be described. Magnetite can produce a solid solution with cobalt ferrite at any desirable proportion, thereby forming a spinel type ferrite having the general formula $Co_yFe_{3-y}O_{4+x}$ whose static magnetostriction varies widely with the variation of $y$. We have studied the variation of the magnetostrictive properties in various compositions of ferrite having small $y$, such a range not having been yet studied, as far as we are aware, and found that a composition containing Co in a quantity of from 0.01% to 1.0% by weight is extremely advantageous for the provision of magnetostrictive material of desirable characteristics.

Figure 1:
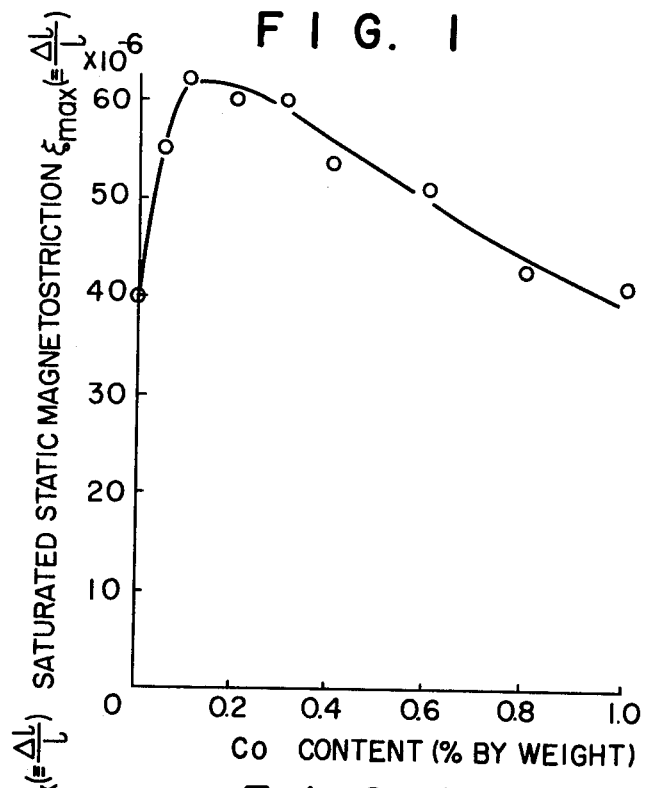
FIG. 1 is a graphical representation indicating the relationship between the saturated static magnetostriction of a magnetite containing cobalt and the cobalt content.

FIG. 1 illustrates the relation between the cobalt content and the saturated magnetostriction of a magnetite which has been sintered at 1,200° C for 10 hours in an atmosphere of pure carbon dioxide gas.

Figure 2:
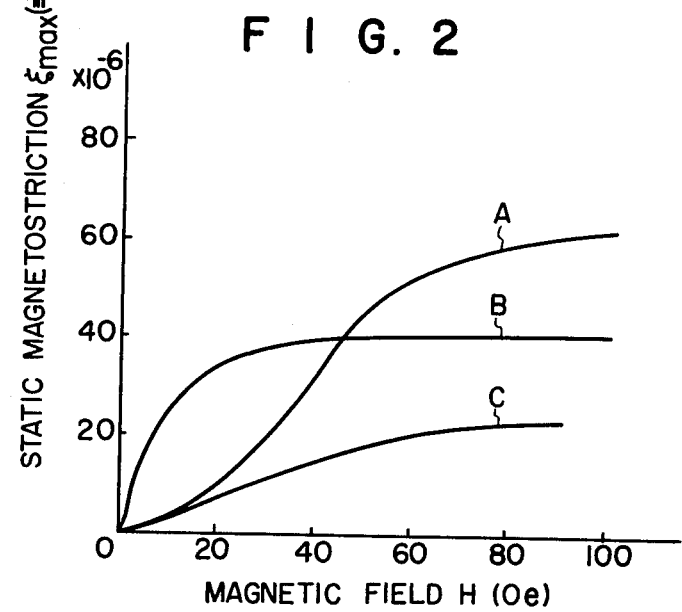
FIG. 2 is a graphical representation indicating the magnetostriction versus magnetic field characteristic of a magnetite ferrite containing cobalt in comparison with similar characteristics of other magnetite ferrites.

In FIG. 2, there are indicated variations in magnetostriction in accordance with variation in magnetic field, of (A) a magnetite containing 0.1% by weight of cobalt; (B) a simple substance of magnetite; and (C) a conventional NI—Cu ferrite, respectively.

As described hereinbefore, the conventional Ni containing ferrite has a negative saturated magnetostriction up to $26 \times 10^{-6}$ as the absolute value, whereas a magnetite ferrite according to this invention has a positive saturated magnetostriction higher than $35 \times 10^{-6}$. In contrast with these values, a magnetite ferrite containing cobalt in a range of from 0.01 to 1.0% by weight has a maximum saturated magnetostriction of $+62 \times 10^{-6}$, and the production cost thereof is low. Cobalt is preferably added in the form of powdery cobalt or cobalt oxides (CoO, $Co_3O_4$, and the like) having an average particle size of from 1.02 to 20 $\mu$, particularly from 0.02 to 5 $\mu$ to the starting iron oxide which is also in the powdery state not yet sintered. The above-mentioned percentages of cobalt (or cobalt oxides) are those converted into percentages in terms of cobalt contained in the resultant sintered magnetite. Although the content of a minute amount of cobalt can contribute to the improvement of the saturated static magnetostriction, a practically significant improvement of the magnetostriction is obtained when more than 0.01% by weight of cobalt is added thereto. It is also found that the saturated magnetostriction is quickly reduced when the content of cobalt in the magnetite exceeds 1.0% by weight of the resultant sintered magnetite. Thus, the range for cobalt content of from 0.01 to 1.0% by weight is used in the present invention.

Figure 9:
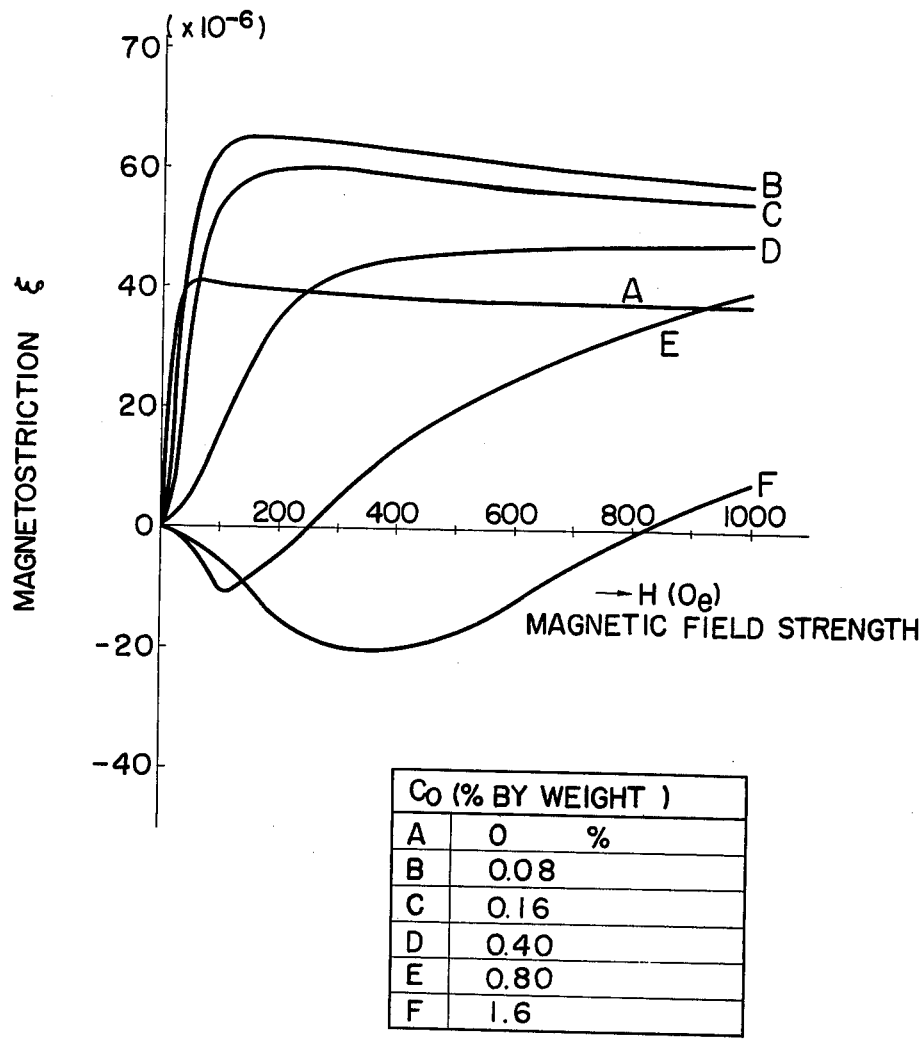
FIGS. 9 and 10 are graphical representations of static magnetostrictions of magnetites containing varied amounts of cobalt against variation of magnetic field applied thereto, wherein curves A through H respectively represent magnetites containing cobalt in the following percentages by weight, A : 0%, B : 0.08%, C : 0.16%, D : 0.40%, E : 0.8%, F : 1.6%, G : 4.0%, and H : 20%.
Figure 10:
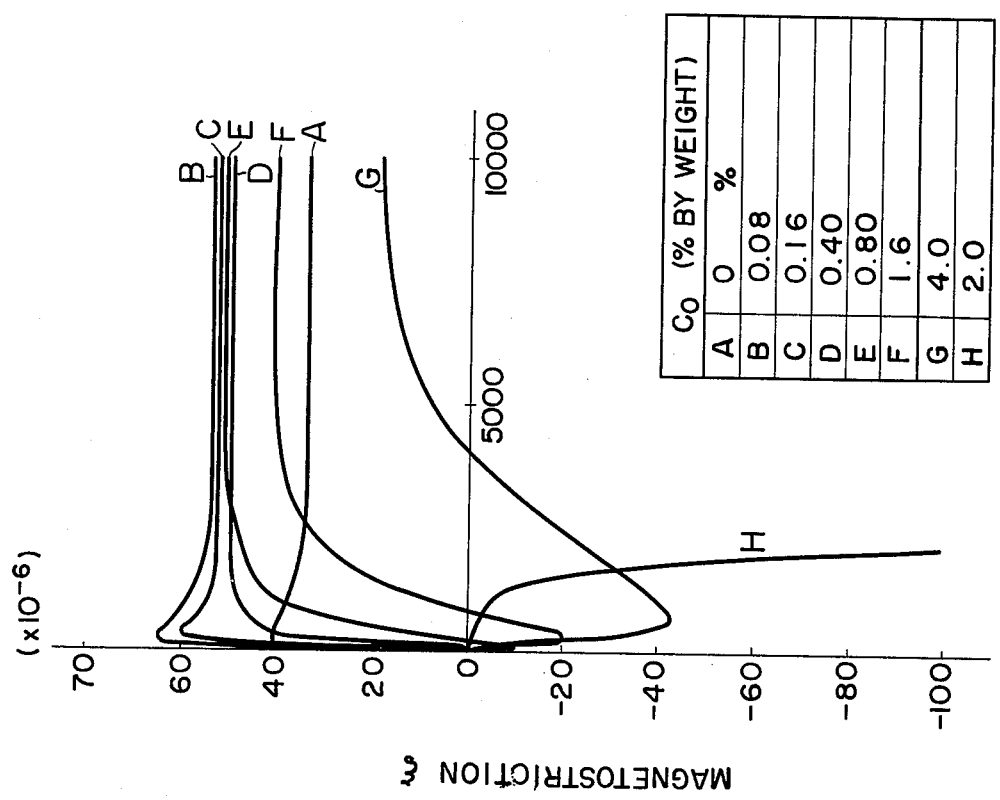

In FIG. 9, variation of the static magnetostriction caused by the addition of a small amount of cobalt is indicated in a range of from 0 to 1,000 oersted by the use of six samples A through F all sintered at 1,250° C for 5 hours, their cobalt contents being respectively A : 0%, B : 0.08%, C : 0.16%, D : 0.40%, E : 0.80%, and F : 1.6% by weight. Furthermore, in FIG. 10, the variation of the static magnetostriction caused by the addition of cobalt is indicated in a range of from 0 to 10,000 oersted by the use of eight samples whose cobalt contents are in a range of from 0 to 20% by weight. As will be apparent from these figures, the static magnetostriction is always positive in the entire range of the magnetic field when the cobalt content is of a small percentage. However, as the cobalt content further increases, the static magnetostriction becomes negative under a weak magnetic field although it becomes positive under a strong magnetic field. When the cobalt content exceeds a certain value, the static magnetostriction is kept negative.

As for the properties required for a magnetostriction material, high absolute value of the above described static magnetostriction, large gradient of its $\xi$-H curve, and large electroacoustic efficiency are deemed to be essential. However, for practical use, the quality of the magnetostciction material is judged by the electromechanical coupling coefficient K which is a dynamic measured value taking into account all of the above described properties.

Figure 11:
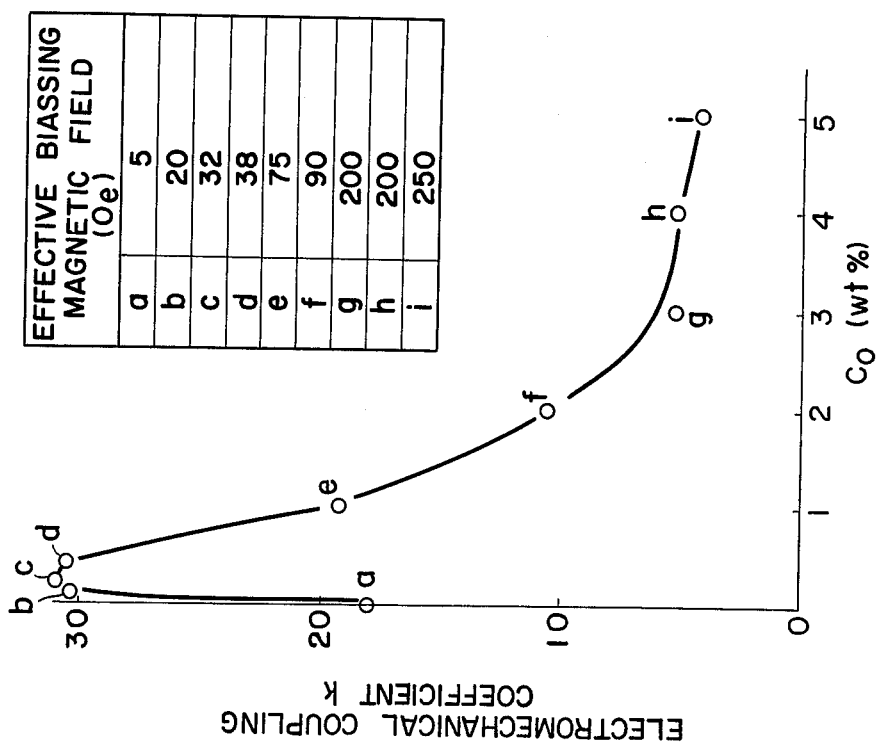
FIG. 11 is a graph showing k-values of magnetite specimens containing different amounts of cobalt, the k-values being obtained at the time of applying magnetic fields optimum for those specimens.

The measurement of this k value is carried out under a constant biasing magnetic field, but the measured value of $k$ is sometimes changed by the strength of the latter field. In FIG. 11, there are indicated maximum values of $k$ of samples having different cobalt contents at the time an optimum biasing magnetic field is applied to each of the samples. The optimum biassing magnetic field is varied by the cobalt content of the sample as follows:

| Sample # | a | b | c | d | e | f | g | h | i |
|---|---|---|---|---|---|---|---|---|---|
| Cobalt content (%by wt.) | 0 | 0.1 | 0.2 | 0.4 | 1 | 2 | 3 | 4 | 5 |
| Optimum effective bias(oe.) | 5 | 20 | 32 | 38 | 75 | 90 | 200 | 200 | 250 |

Under the application of an optimum biasing magnetic field, the addition of 1% of cobalt makes possible the production of a k value higher than that for a simple substance of magnetite. As will be apparent from the figures, the optimum biasing magnetic field is made higher by the addition of cobalt. On the other hand, an effective magnetic field which can be produced by a hard magnet or an electromagnet of a size ordinarily assembled in a magnetostrictive vibrator, is of the order of up to 50 oersted, although the value can be varied depending on the shapes and others of the magnetostrictive element and the biasing magnet. For this reason, it is desirable to select a magnetostrictive material which can provide a k-value higher than that of the simple substance of magnetite under an effective biasing magnetic field in a range of from 0 to 50 oersted.

Figure 12:
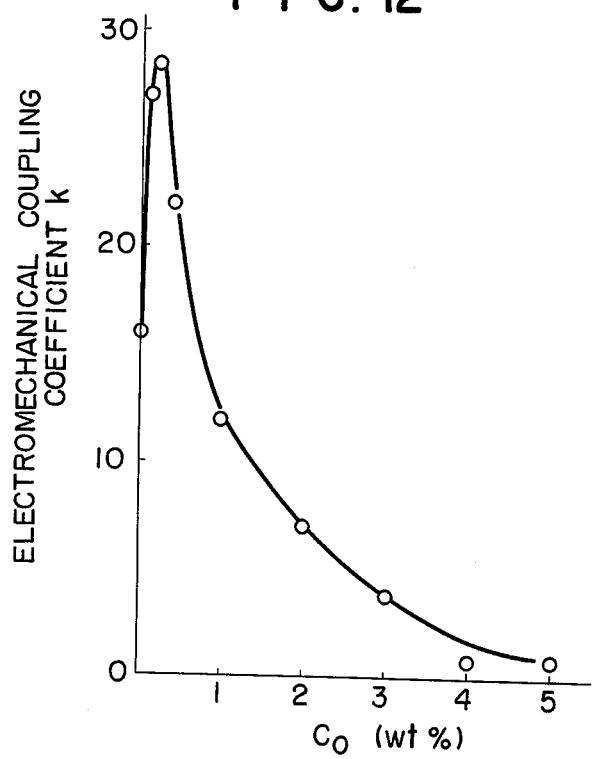
FIG. 12 is a graph showing the k-values for the same specimens as shown in FIG. 11, where a constant biasing magnetic field of 50 oersted is applied to these specimens.

In FIG. 12, there is indicated the relation between the k-value and the cobalt content under the application of an effective biasing magnetic field of 50 oersted. It is apparent from the figure that an addition of cobalt less than 0.5% by weight is desirable for obtaining a higher value of k under a biasing magnetic field lower than the easily avialable 50 oersted. With these facts in view, the cobalt content is preferably in a range of from 0.01% to 0.5% by weight, and more preferably in a range of from 0.05% to 0.4% by weight.

The production and properties of the cobalt containing magnetite series ferrites are illustrated in the following Examples 3 and 4.

EXAMPLE 3

A magnetite available on the market was mixed with cobalt oxide (CoO) of 0.01% by weight converted into cobalt content, and shaped under application of a pressure of 1.5 ton/cm² into samples. The samples were sintered at 1,100° C for 8 hours in an atmosphere of carbon dioxide gas thereby to obtain bar-shaped sintered magnetite measuring 15 × 15 × 85 mm. The saturated static magnetostrictions of these bars were found to be 54 × $10^{-6}$ widely exceeding the amount 38 × $10^{-6}$ for the simple magnetite ferrite. The average specific resistance of the bars was 0.3 ohm-cm, and the O/Fe ratio thereof was 4,006/3.

EXAMPLE 4

A magnetite available on the market was mixed with 0.2%, 0.6%, and 1.0% by weight of powdery cobalt, respectively, and formed into samples which were sintered at 1,300° C for 8 hours in an atmosphere of argon gas. The measured values of the saturated static magnetostriction of the sintered samples were 50 × $10^{-6}$, 52 × $10^{-6}$, and 41 × $10^{-6}$, respectively, far greater than the above-mentioned 36 × $10^{-6}$ for the magnetite without additives. The average specific resistance of the samples was 26 ohm-cm, and the O/Fe ratio thereof was 4.07/3.

The magnetite ferrite according to another aspect of the present invention will now be described. When the magnetite as described hereinbefore is provided with titanium added thereto in a quantity of from 0.006 to 3% by weight, the specific resistance of the magnetite is found to be improved remarkably. Titanium to be added to powdery magnetite before it is sintered may be titanium singly or titanium oxides such as $TiO_2$, $FeTiO_3$, or the like, but preferably of a particle size less than one micron. Otherwise, the titanium may be added to the powdery magnetite in the form of salts such as titanium sulfate and the like. Particularly, when the magnetite is produced from iron sulfate containing titanium sulfate, a ferrite of better uniformity can be obtained. The titanium content in the ultimate sintered ferrite is preferably in a range of 0.006 to 3% by weight.

The reason why the electrical resistance of the ferrite is widely increased by the inclusion of a slight amount of titanium is related to the mechanism causing the electrical conductivity in magnetite.

In magnetite, $Fe^{2+}$ and $Fe^{3+}$ are contained in a ratio of 1:2. The electrical conductivity is caused by electrons hopping between these atoms. Accordingly, if the arrangement of the atoms $Fe^{2+}$ and $Fe^{3+}$ is disturbed by the titanium contents, the electrical conductivity thereof is lowered, and hence the electric resistivity thereof is elevated. Titanium is supposedly introduced by a small amount into the structure of the magnetite in the form of $Ti^{4+}$, and these $Ti^{4+}$ atoms greatly disturb the hopping movements of electrons between the $Fe^{2+}$ and $Fe^{3+}$ thereby increasing the electrical resistance of the magnetite. The practical production and the properties of the ferrite according to this aspect of invention are shown in the following Examples 5 and 6.

EXAMPLE 5

Figure 3:
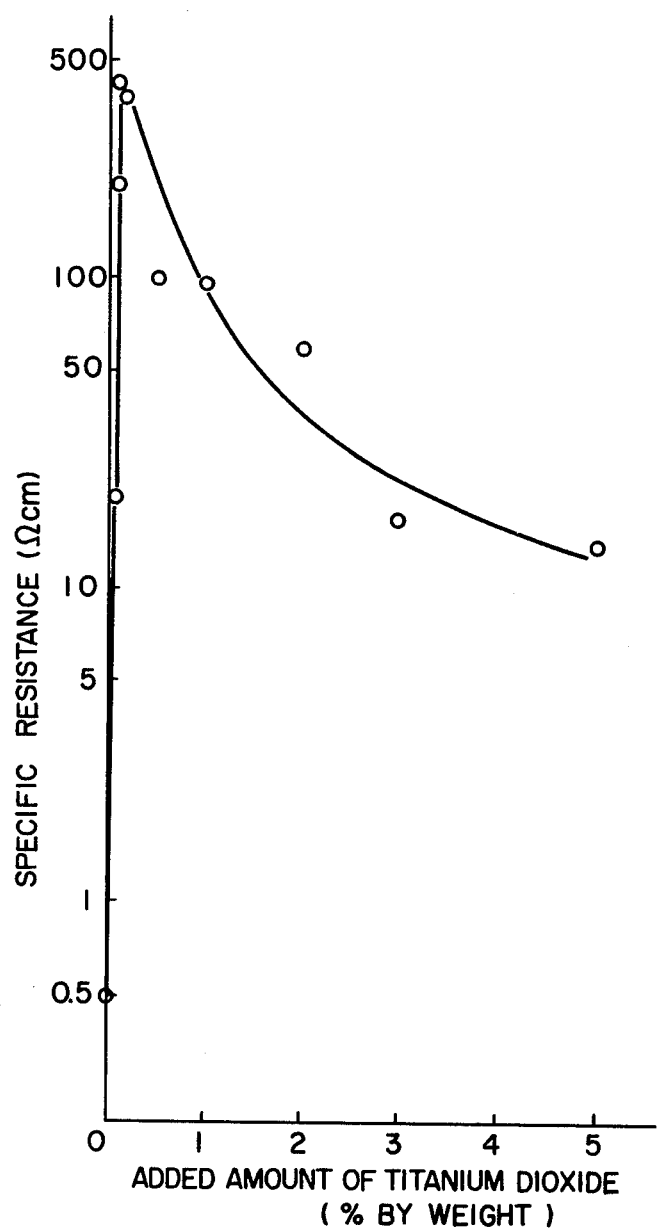
FIG. 3 is a graphical representation indicating the interrelation between specific resistance and titanium dioxide content in another example of a magnetite ferrite containing titanium.

Magnetite of a kind available on the market was added by 0.001, 0.05, 0.1, 0.2, 0.5, 1.0, 2.0, 3.0, and 5.0% by weight of granular titanium dioxide of an average particle size of 0.1 micron. The above described kinds of mixtures were then agitated thoroughly by mechanical agitators, and then formed into samples (three for each kind) under a pressure of 1.5 ton/cm². The samples were then sintered at a temperature of 1,300° C so that ferrites each having a size of 15 × 15 × 80 mm were obtained. O/Fe ratios of the ferrites were in a range of (4.04±0.02)/3. Beside of the above-mentioned ferrites, samples having no titanium dioxide were also provided for reference purpose. Average specific resistances, one for each kind of the ferrites, were measured and plotted in FIG. 3. From the Figure, it is apparent that the ferrites containing from 0.1 to 0.2% by weight of titanium dioxide exhibit higher specific resistances, and that the ferrite containing titanium dioxide nearly 5% by weight exhibits a specific resistance considerably higher than that containing no titanium dioxide.

Furthermore, the electromechanical coupling coefficient showing the degree of adaptability to the magnetostrictive usage of the ferrites gradually increases in accordance with the increase in the content of titanium dioxide in a range of from 0.01 to 5% by weight. Thus, in consideration of all of the properties required for the ferrite for the magnetostriction vibrator, the ferrite having the content of titanium dioxide in a range of from 0.01 to 5% by weight (from 0.006 to 3% by weight when converted into percentages of titanium element only) are considered most suitable.

When the properties of the ferrites are compared with those of no titanium content, the specific resistance thereof containing 0.1% by weight of titanium dioxide was found to be elevated to approximately 420 ohm-cm, while that of the ferrite having no titanium was merely 0.5 ohm-cm. Furthermore, the electromechanical coupling coefficient of those containing titanium was elevated to 0.26 somewhat greater than 0.24 for the ferrite containing no titanium.

EXAMPLE 6

An iron sulfate solution containing titanium sulfate of an amount corresponding to 10% by weight in terms of titanium content was oxidized by adding an alkali thereby to obtain a powdery magnetite containing titanium. The powdery magnetite was formed into samples and sintered in the same manner as described in Example 5. Average specific resistance of the samples thus sintered was found to be 85 ohm-cm, and the average O/Fe ratio thereof was found to be 4.03/3.

As a modification of this aspect of the invention, magnetites containing titanium and cobalt may also constitute ferrites having high electrical resistances and high saturated magnetostrictions well adapted for the application to magnetostriction vibrators. These kinds of ferrites will now be described in the following example.

EXAMPLE 7

Figure 4:
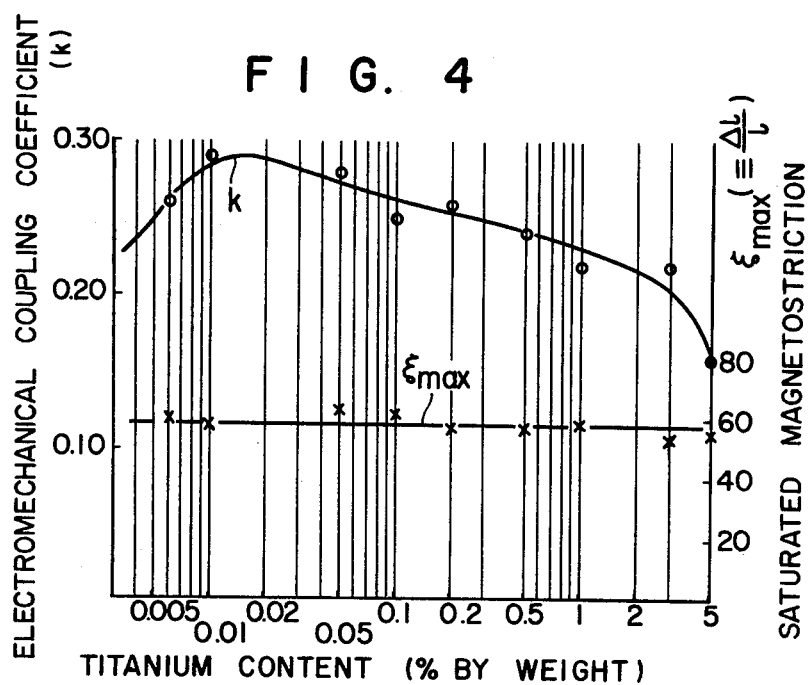
FIG. 4 is a graph indicating the variations of saturated magnetostriction and electromechanical coupling coefficient with variation in titanium content in still another example of a magnetite ferrite containing titanium.

To a magnetite available on the market, cobalt oxides of an amount corresponding to 0.1% by weight in terms of the cobalt element and titanium dioxide of amounts corresponding to 0.006, 0.01, 0.05, 0.1, 0.2, 0.5, 1.0, 3.0, and 5.0% by weight in terms of the titanium element were added. The mixtures of the above described contents were then grounded and mixed, separately, in a ball mill for 2 hours, and formed into samples under application of 1.5 ton/cm² pressure. The samples were sintered at 1,200° C in the atmosphere of argon gas for five hours, and made into sintered samples each having a bar-like configuration of 15 × 15 × 85 mm. The saturated static magnetostrictions and the electromechanical coupling coefficients of the samples were varied as shown in FIG. 4 in accorcance with the variation in the titanium content. As is apparent from FIG. 4, the saturated magnetostriction is substantially not varied by the addition of titanium dioxide. However, the electromechanical coupling coefficient can be improved by the addition of titanium, and is elevated to a maximum value at a content of 0.01% by weight of titanium.

This feature corresponds to the fact that the electrical resistance thereof goes up to a maximum value of 480 ohm-cm at a content of titanium approximately equal to the above described value.

According to the present invention, in another aspect thereof, the specific resistance of the magnetite type ferrite may also be elevated by the addition of calcium instead of titanium or cobalt as described in the previous aspects of the invention. Calcium may be added in the form of a single substance, or in the form of compounds such as calcium oxide (CaO), calcium carbonate (CaCO₃), and the like, in the magnetite of powdery structure before the latter is sintered. The quantity of calcium or calcium compound to be added into the magnetite is preferably in a range of from 0.002 to 3.0% by weight converted into those in terms of calcium element. Although a slight amount of calcium added to the magnetite can improve the specific resistance and the transverse rupture strength considerably, a content of calcium more than 0.002% by weight is required practically. In the case where the content of calcium exceeds 3.0% by weight of the entire ferrite, the specific resistance thereof may still increase. However, the transverse rupture strength of the ferrite in this case was reduced, and hence the upper limit of the content of calcium is thereby selected to the 3.0% by weight of the entire ferrite.

Figure 5:
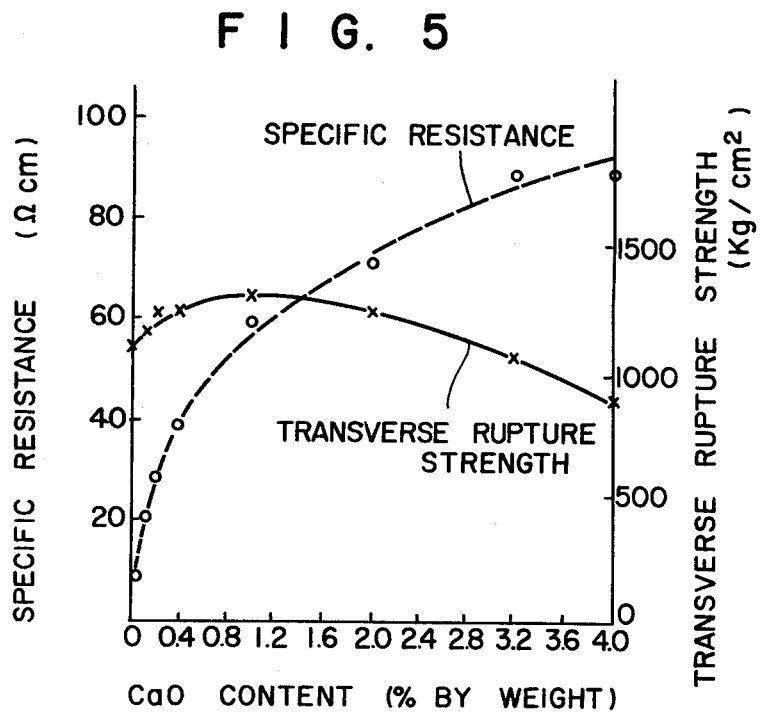
FIG. 5 is a graph indicating the variations of specific resistance and transverse rupture strength with variation in added CaO in still another example of a magnetic ferrite containing calcium.

The specific resistance and the transverse rupture strength of the ferrite vary in accordance with the variation in percentage by weight of CaO added to the magnetite as shown in FIG. 5. In the case where the calcium is added in the form of calcium carbonate, similar results are obtained when the percentage of the calcium carbonate converted to that of CaO is equivalent to those indicated in FIG. 5.

The sintering of the ferrite of this aspect can be carried out in an ordinary manner with the magnetite material used therefor being of the kind available on the market. The production and properties of the ferrites according to this aspect of the invention are indicated in Examples 8, 9, and 10.

EXAMPLE 8

Magnetite available on the market was added with calcium oxide (CaO) thereby to contain 0.01% by weight of calcium. The magnetite thus added with CaO and magnetite not added with CaO were each formed into three samples under application of 1.5 ton/cm² pressure, and sintered at 1,300° C for 5 hours in the atmosphere of argon gas thereby to obtain bar-shaped products each having a size of 15 × 15 × 85 mm. The average specific resistance of the samples added with CaO was 8.2 ohm cm, while that of the samples not added with CaO with 0.2 ohm cm. The electroacoustic efficiencies, each corresponding to the amount of the eddy current loss, of the samples containing CaO were higher than 95%, while the same efficiencies for the samples containing no CaO did not exceed 87.5%.

[Reference Example]

A sample made of a magnetite available on the market added with powdery calcium carbonate of an average grain size of 0.05 micron and with 4.0 mol % of Ca was sintered as in the previous examples. The specific resistance thereof reached 90 ohm cm, and the electroacoustic efficiency thereof was more than 99%. However, the transverse rupture strength thereof was found to be inferior to that of the magnetite containing no additives.

EXAMPLE 9

One part of magnetite available on the market was added with cobalt oxide (Co₃O₄) of 1.0% by weight in terms of cobalt. The magnetite thus added with the cobalt oxide and other part of the magnetite not containing cobalt oxide were both added with calcium carbonate of 0.002, 0.02, 0.2, and 2% by weight in terms of calcium, respectively, and sintered in a manner as described in Example 7. The electromechanical conversion coefficients of these samples were as indicated in the following Table.

| Calcium content (% by weight) | | 0.002 | 0.02 | 0.2 | 2 |
|---|---|---|---|---|---|
| Electromechanical coupling coefficient | Containing 1% by weight of cobalt | 0.25 | 0.27 | 0.27 | 0.28 |
| | containing no cobalt | 0.18 | 0.23 | 0.22 | 0.24 |
| Specific resistance (ohm-cm) | | 0.2 | 9.5 | 42 | 67 |

As will be apparent from this Table, the electromechanical coupling coefficient in each of the magnetites increases gradually in accordance with increase in the calcium content. Furthermore, it is apparent that the coefficient was improved in a cumulative manner by adding both of the cobalt oxide and calcium carbonate.

EXAMPLE 10

A commercially available magnetite was added with 0.2% by weight of powdery cobalt, 0.1% by weight of powdery titanium, and calcium oxide (CaO) of 0.5% by weight in terms of calcium. The mixture was further grounded and mixed in a ball mill for two hours, and then formed into blocks. The blocks were then caused to react at 1,050° C for 5 hours in carbon dioxide gas, whereupon the blocks were grounded into powder having an average grain size of two microns. The powder of the composite composition was then formed into samples under application of 1.5 ton/cm² pressure, and sintered at 1,200° C for ten hours in the atmosphere of carbon dioxide gas. The average specific resistance of the samples was 480 ohm cm, and the average electromechanical coupling coefficient thereof was as high as 0.29.

In still another aspect of the present invention, one or more of $SiO_2$, $B_2O_3$, and $Na_2B_4O_7$ are added into magnetite in a range of from 0.1 to 2.0% by weight for the purpose of improving the mechanical strength. By the addition of the above-mentioned substance, the density of magnetite can be elevated at a comparatively low temperature, and the mechanical strength thereof is sufficiently improved to withstand continuous operation as a magnetostriction vibrator. Generally speaking, the mechanical strength of magnetite is varied not only by the degree of density of the magnetite but also by the degree of the uniformity, both of which are improved by the addition of one or more of $SiO_2$, $B_2O_3$, and $Na_2B_4O_7$ in the above described range of percentage.

In FIG. 6, there are indicated mechanical strength and more particularly transverse rupture strength of sintered magnetite type ferrites containing varied quantities of $SiO_2$, $B_2O_3$, or $Na_2B_4O_7$, respectively, and sintered at 1200° C. As is apparent in FIG. 6, the rupture strengths of the ferrites are comparatively high. Although the transverse rupture strengths can thus be elevated by the addition of the abovementioned additives in slight quantities, the strengths cannot be as high as a desired level if the content of the additives is less than 0.1% by weight of the entire ferrite. Thus the desirous content of the additives is selected in a range of from 0.1 to 20% by weight of the entire ferrite.

In FIG. 7, there is indicated interrelation between the electromechanical coupling coefficient of the magnetite type ferrite and the quantity of $SiO_2$, $B_2O_3$, or $Na_2B_4O_7$ added thereto. As will be apparent from the graphical representation, the electromagnetic coupling coefficient is comparatively high in the above-mentioned range of the content of the additives. However, if the percentage of the additive is reduced less than 0.1%, the electromechanical coupling coefficient descends far less than the desired level. This aspect of the present invention will be more fully made apparent from the following Examples 11 through 15.

EXAMPLE 11

0.5% by weight of $SiO_2$ was added to powdery magnetite of an average grain diameter of 1.2 micron, and was further mixed together. The mixture was then formed under application of 1.0 ton/cm² static pressure into a square barshaped sample of 12 × 12 × 80 mm. The sample was sintered at 1,200° C in the atmosphere of argon gas containing oxygen with a partial pressure of $10^{-6}$ atm., so that sintered sample having a theoretical density of 98.5% was obtained. It was found that the sintered sample had electromechanical coupling coefficient of 0.32, O/Fe ratio of 4,015/3, specific resistance of 6.5 ohm-cm, and a transverse rupture strength of 1,300 kg/cm².

EXAMPLE 12

0.1% by weight of $SiO_2$ and 0.5% by weight of $B_2O_3$ were added in powdery magnetite of an average grain diameter of 2.5 microns, and the mixture was formed into samples of the same size under the condition as described in Example 11. The samples were then sintered in an atmosphere of nitrogen gas mixed with oxygen having a partial pressure of $10^{-2}$ atm., at 1,350° C until an average density as high as 99.0% of the theoretical density could be obtained. The average electromechanical coupling coefficient of the sintered samples was 0.33, O/Fe ratio thereof was 4.09/3, specific resistance thereof was 27 ohm.cm and the average transverse rupture strength thereof was 1,250 kg/cm².

EXAMPLE 13

20% by weight of $SiO_2$ was added to a magnetite powder of average grain diameter of 0.4 micron, and the mixture was mixed and ground for 30 min. in a vibration ball mill. The mixture was then formed under application of 1.5 ton pressure in a hydraulic press into samples of square bar of 12 × 12 × 100 mm. The samples were then sintered in a vacuum having a partial pressure $10^{-10}$ atm. of oxygen at 1,050° C until an average density of 97.4% of the theoretical density could be obtained. The average electromechanical coupling coefficient of the sintered samples was 0.24, O/Fe ratio thereof was 4,002/3, the specific resistance was 0.15 ohm-cm, and the average transverse rupture strength of the same was 1,080 kg/cm².

EXAMPLE 14

3% by weight of dehydrated borax was added in powdery magnetite having an average grain diameter of 1.2 microns. The mixture was formed into samples in the same manner as illustrated in Example 11, and sintered in the atmosphere of Ar gas containing oxygen at a partial pressure of $10^{-3}$ atm., at 1,150° C until sintered samples having an average density of 98% of the theoretical density could be obtained. The average electromechanical coupling coefficient of the sintered samples was 0.29, O/Fe ratio thereof was 4,015/3, specific resistance thereof was 6.5 ohm-cm, and the average transverse rupture strength was 1,220 kg/cm².

EXAMPLE 15

5% by weight of powdered $B_2O_3$ was added to powdery magnetite of an average grain diameter of 1.2 microns. The mixture was formed into samples in the same manner as shown in Example 11, and sintered in the atmosphere of Ar gas containing oxygen at a partial pressure of $10^{-6}$ atm., at 1,200° C until sintered samples having an average density of 97.5% of the theoretical density were obtained. The average electromechanical coupling coefficient of the sintered samples was 0.28, the O/Fe ratio was 4.03/3, the specific resistance was 18 ohm-cm, and the average rupture strength was 1,300 kg/cm².

As described above, according to this aspect of the invention, the mechanical and magnetostrictive properties of the sintered samples can be improved by the addition of one or more of $SiO_2$, $B_2O_3$, and $Na_2B_4O_7$, whereby the sintered magnetite, which has not been used practically for the production of ferrites, is made possible to be used for the industrial production thereof and to be applied to magnetostriction vibrators.

In all of the above described Examples, the O/Fe values of magnetites obtained by the above described calculation method were in the range of $4.0/3 \leq$ O/Fe $< 4.1/3$.

The magnetostrictive element according to the present invention can be produced with various shapes, such as round or square bars including plates, $\pi$, NA, rings and hollow cylindrical constructions of various sizes. However, it is preferable, on the assumption that the element resonates at a half of the wavelength, to select the shape and size thereof such that a resonance frequency is provided in a range of from 10 KHz to 100 KHz, more preferably from 15 KHz to 100 KHz.

When it is desired to mount a magnetostrictive element in an ultrasonic equipment, such as an ultrasonic machine or tool or an ultrasonic washing machine, the element may be secured directly onto the body of the equipment or to a bracket extending therefrom by the use of an adhesive agent. Alternatively, the magnetostrictive element may be first assembled, as hereinafter described in more detail, into a magnetostrictive vibrator by the use of fixing means such as fixing plates and bolts and nuts, and one of the fixing plates of the vibrator may then be secured to the body of the ultrasonic equipment or a bracket extending therefrom.

Some of the preferred examples of the construction of the magnetostrictive vibrator including the magnetostrictive elment according to this invention will now be described in detail with reference to FIGS. 14, 15, and 16, wherein the magnetostrictive ferrite elements of NA(shape), $\pi$ shape, and a cylindrical shape are respectively provided with means for fixing and compressing the elements.

Figure 14:
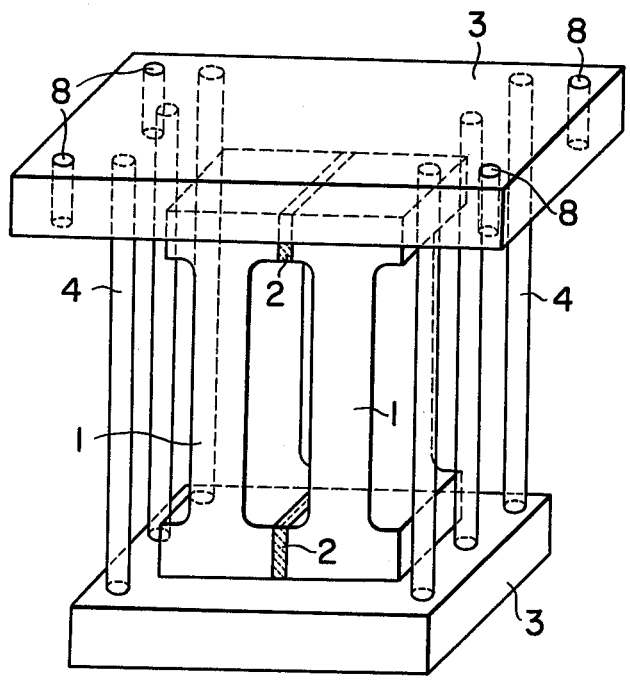
FIGS. 14 and 15 are perspective views showing magnetostrictive vibrators comprising magnetostrictive elements 1 of NA type and π type, respectively, both being placed under a compressive load, wherein numerals 2, 3, and 4 designate a bias magnet, clamping plates, and clamping bolts, respectively.
Figure 15:
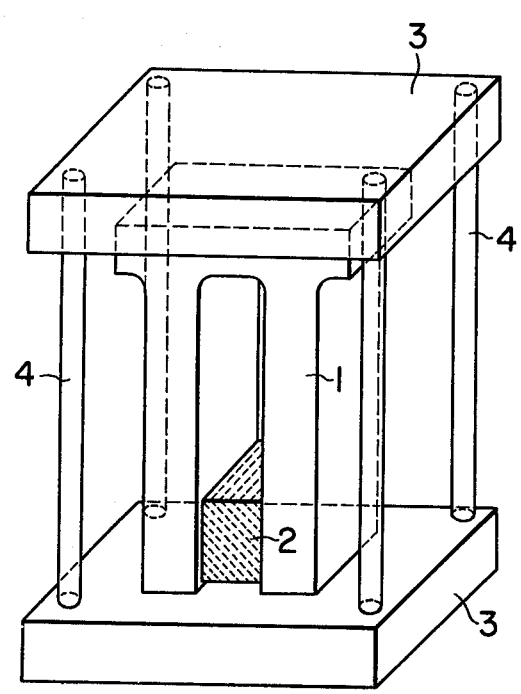

In FIGS. 14 and 15, numeral 1 designates a magnetite magnetostrictive element having positive static magnetostriction, numeral 2 designates a biasing magnet made of a hard magnet material such as Ba ferrite or Sr ferrite, and numeral 3 designates clamping plates whose flat surfaces are brought in to contact with the end surfaces, in view of the vibrating direction, of the magnetostrictive element 1, and are clamped by means of a plurality of bolts 4 to the same element, so that a compressive force will be applied evenly to the same element. Numeral 8 indicated only in FIG. 14 designates holes provided through one of the clamping plates 3 for securing the thus formed magnetostrictive vibrator to the body of the ultrasonic equipment or to the bracket extending therefrom.

The magnetostrictive vibrator may be secured in various ways other than those described above, to the ultrasonic equipment. For instance, in FIG. 14, the upper clamping plate 3 may be further extended, for instance, leftwardly, and the thus extended part of the clamping plate 3 may be used for securing the vibrator to the body of the ultrasonic equipment, or the bolts 4 in FIG. 14 may be further extended and may be used for securing the vibrator to the ultrasonic equipment.

Conventionally, the magnetostrictive element has been secured to the body or bracket of an ultrasonic equipment with the upper or side surface directly fixed thereto ordinarily with an adhesive agent of organic type (in such a case, the magnetostrictive element itself constitutes a magnetostrictive vibrator). It is not impossible to use the magnetostrictive element according to this invention in such an ordinary manner, but for the hereinafter described reason, the element is preferably used under a compressive load with both end surfaces being clamped as shown in FIGS. 14, 15, and 16. The bolts 4 may be replaced by a plurality of clamping means of any suitable construction. The magnetostrictive element 1 is provided with a coil (not shown) therearound at a rate of about 5–30 turn/leg and, by applying an alternative input power to this coil, an ultrasonic vibration is generated from the end surface of the clamping plate 3. Further, the biasing magnet 2 may be omitted in the case where a d.c. current is superposed onto the alternative current applied to the aforesaid coil to provide a biasing magnetic field.

Figure 16:
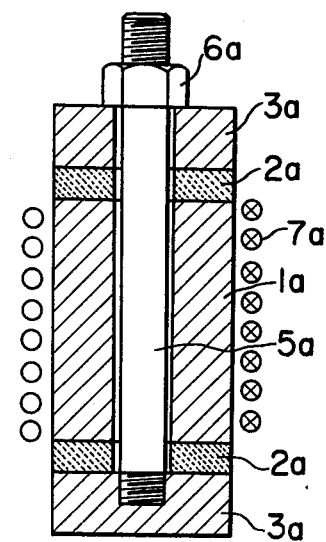
FIG. 16 is a longitudinal sectional view of a vibrator including a cylindrical piece 1a of a magnetostrictive material subjected to a compressive load, wherein numerals 2a, 3a, 5a, 6a, and 7a designate a bias magnet, clamping plates, clamping bolts, nuts, and a winding thereof, respectively.

In FIG. 16, there is indicated another type of ferrite vibrator wherein ring-shaped biasing magnets 2a are placed in contact with the upper and lower end surfaces, in view of the vibrating direction, of a cylindrical magnetostrictive element 1a made of a magnetite ferrite, and the thus obtained assembly is further clamped between a pair of annular clamping plates 3a by the use of a set of bolts 5a and nuts 6a. A coil 7a is wounded around the magnetostrictive element 1a.

Figure 21:
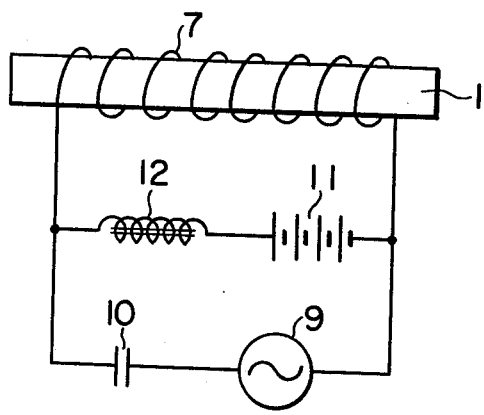
FIG. 21 is a fundamental arrangement of an electric circuit wherein an a.c. magnetic field is applied to a magnetostrictive vibrator.

The magnetostrictive vibrators of the above described constructions can be operated by applying an a.c. magnetic field to each of the vibrators through a suitable procedure. FIG. 21 indicates a fundamental arrangement for exciting the magnetostrictive vibrator by an a.c. magnetic field. In FIG. 21, there is indicated a magnetostrictive vibrator 1 (of round bar shape in this example), with a coil 7 wound around its leg (one leg in this example) extending in the direction of the vibration, the number of turns of the coil 7 ordinarily ranging from 5 to 30 per leg. The coil 7 comprises means for applying an alternating magnetic field to the vibrator 1. The coil 7 is shunted by an a.c. power source unit comprising an a.c. power source 9 of from 10 to 100 KHz and a d.c. cutoff capacitor 10, to which a biasing d.c. unit comprising a d.c. power source 11 and a choke coil 12 is connected in parallel. The biasing d.c. unit and the capacitor 10, which may be omitted, are preferably used so that.the magnetostrictive vibration can be effected in a steep rising part of the characteristic curve showing the relation between magnetostriction and magnetic field. The d.c. biasing unit and the capacitor 10 may be omitted particularly in the instances where a biasing magnet or magnets 2 are provided as shown in FIGS. 14, 15, and 16 for establishing a d.c. magnetic field in the magnetostrictive element 1, thus economizing the power consumption.

The magnetostrictive element according to this invention has a positive magnetostriction as described hereinbefore, and we have further found that it is preferable from the mechanical point of view and for effective generation of magnetostrictive vibration that a compressive force is applied across the end surfaces of the magnetostrictive element 1. The reason for this is as follows.

Although the ferrite has various advantageous properties in comparison with metallic magnetostrictive elements, it has a shortcoming of mechanical strength inherent to ceramics. Further, an adhesive agent, ordinarily of an organic type, has been used for securing the ferrite vibrator to a vibrating disk of a machine tool or to a vibration transmitting element of a washing machine. At the time of vibration having a wide amplitude, this adhesive agent, however, is frequently subjected to severe deterioration, and as a result, the magnetostrictive element tends to be peeled off the vibrating part of the apparatus, thereby to be broken due to no-load operation of the vibrator.

After several experiments, we have found that:

(1) Although the tensile strength of ferrite is comparatively low, the compressive strength thereof is about 10 times the tensile strength or higher. Thus, the fragility of ferrite at the time of vibration which involves repetitions of a tension and a compression is considered to result from the low tensile strength thereof.

The low mechanical strength of the ferrite at the time of vibration can be improved by applying a compressive force to the ferrite before the ferrite is subjected to an ultrasonic vibration, thereby eliminating the occurrence of tensile stress in the ferrite during the vibration.

Figure 13:
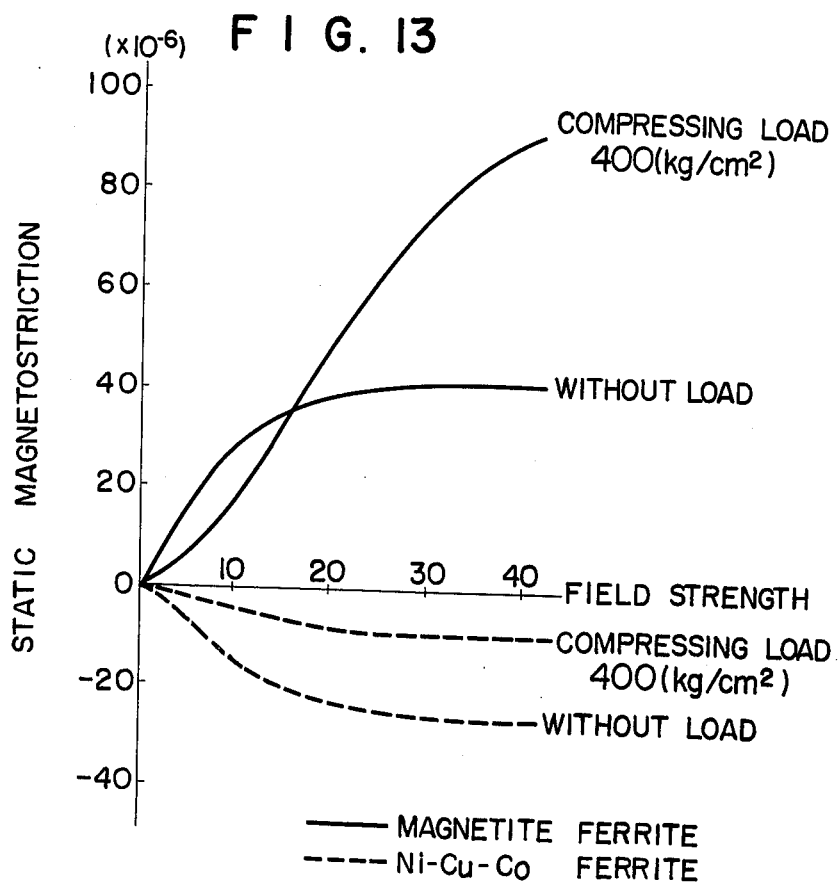
FIG. 13 is a graph showing the relation between the static magnetostrictions, under compressive loads, of magnetite ferrite and Ni—Cu—Co ferrite vibrators and the magnetic field applied thereto.

(2) The variation in static magnetostriction of conventional Ni—Cu—Co ferrite available on the market against varied loads is indicated in FIG. 13. As is clear from the figure, the negative value of the magnetostriction of the Ni—Cu—Co ferrite, which has a negative static magnetostrictive property, is substantially reduced under application of a compressive force, thus reducing the ultrasonic conversion efficiency to a great extent. This means that the above described method of improving the mechanical strength cannot be applied to the Ni—Cu—Co ferrite.

(3) As described hereinbefore, the magnetostrictive material principally consisting of magnetite exhibits a tendency just opposite to the above described property of the Ni—Cu—Co ferrite. As also indicated in FIG. 13, a ferrite having a positive static magnetostriction, to which a compressive load of 400 Kg/cm$^2$ is applied in the direction of the magnetic field, exhibits a greater static magnetostriction under a strong magnetic field than that of the same ferrite receiving no compressive load. This means that the static magnetostriction of magnetite ferrite, when clamped by bolts and the like, can be increased substantially.

As is apparent from the above described (1), (2), and (3), an ultrasonic ferrite vibrator using a magnetite ferrite as a magnetostrictive material and integrally provided on both sides of the magnetostrictive material in the direction of vibration with fixing means for compressing said material having a structure such that a compressive force ranging from 30 to 1800 kg/cm$^2$ can be applied thereto in the vibrating direction can have advantageous features such as improving its mechanical strength, facilitating its mechanical connection with the ultrasonic apparatus, and ensuring the use of the vibrator under a wider amplitude of vibration, and yet the electromagnetic property of the vibrator is not damaged at all.

Experiments revealed that the optimum compressive force for a vibrator operated at a comparatively lower frequency within the ordinary operational frequency range of from 10 to 100 KHz becomes high, and the optimum compressive force to be applied to a vibrator operated at a higher frequency becomes low. Thus among magnetostrictive vibrators used in a range of from 10 to 100 KHz, for instance a vibrator operable at 10 KHz with an electrical input of 300 W is found to have an optimum compressive force of 1800 Kg/cm$^2$, whereas a vibrator operable at 100 KHz with an electrical input of 5W is found to have an optimum compressive force of 30 Kg/cm$^2$. For this reason, the above described range of the compressive force extending from 30 to 1800 kg/cm$^2$ is considered to be appropriate for the magnetostrictive vibrator of this invention. It has also been found that the optimum compressive force to be applied to the vibrator is not affected by the configuration of its element such as NA type, $\pi$ type, bar type, planar type, or cylindrical type, but is kept substantially constant as far as the operating frequency thereof remains the same.

Characteristic features of the vibrators operated under the above described compressive loads will further be described with reference to FIGS. 17 and 18.

Figure 17:
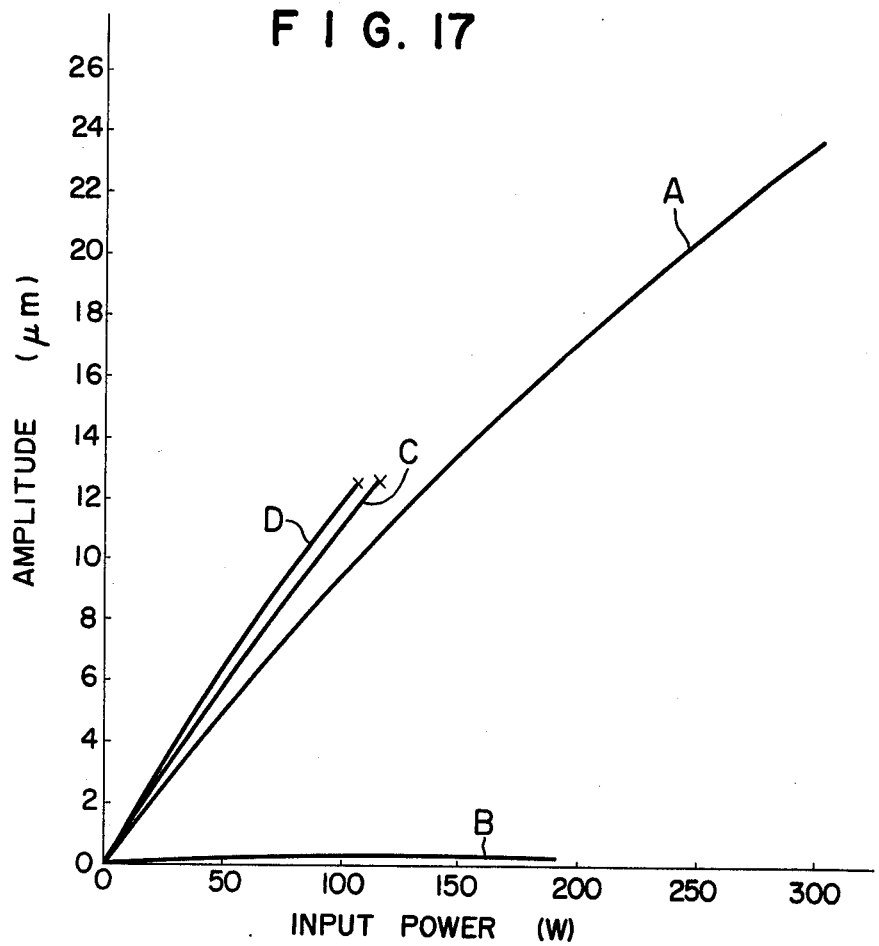
FIG. 17 is a graph showing the input electric power versus output amplitude characteristics of magnetostrictive vibrators made of magnetite ferrite and Ni—Cu—Co ferrite, both in a non-clamped state and a clamped state.

In FIG. 17, there are indicated relations, between the amplitudes of the vibrations and the electrical input, of magnetostrictive vibrators whose magnetostrictive elements are made of different kinds of ferrites, but are formed into a common construction of $\pi$-shape, for use at 28 KHz, and clamped as shown in FIG. 15. In FIG. 17, a curve C represents the above-mentioned relation for the magnetostrictive element containing 0.1% by weight of cobalt, 0.1% by weight of titanium, 0.2% by weight of SiO$_2$, and the balance of magnetite. Another curve D represents the above described relation for the case of magnetostrictive element made of a commercially available Ni—Cu—Co ferrite. A curve B is for a case wherein the element corresponding to the curve D was clamped under a compressive force of 500 Kg/cm$^2$ as shown in FIG. 15, and a curve A represents a case wherein the element corresponding to the curve C was clamped under the same condition as in the curve B.

As shown in FIG. 17, the amplitudes in the magnetostrictive elements not compressed beforehand, as indicated by the curves C and D, become greater with increase in the electric input, but it was found that all the vibrators using these magnetostrictive elements were broken at an amplitude of at most approximately 12 microns due to an insufficient mechanical strength. However, a vibrator according to this invention represented by the curve A, which had been beforehand compressed under a pressure of 500 kg/cm$^2$ by the clamping bolts, was not broken even by a continuous operation under application of an electric input of 300 W, although the increasing rate in the amplitude against the increase in the electric input was found somewhat low in comparison with the cases of the curves C and D. In the case of the curve A, an amplitude as high as 23 microns could be realized, showing a substantial improvement in the maximum allowable amplitude for the vibrator. In contrast, the Ni—Cu—Co ferrite indicated by the curve B which has been compressed as described above showed substantially no occurrence of vibration even after the elevation of the input electric power to a highest possible value.

Figure 18:
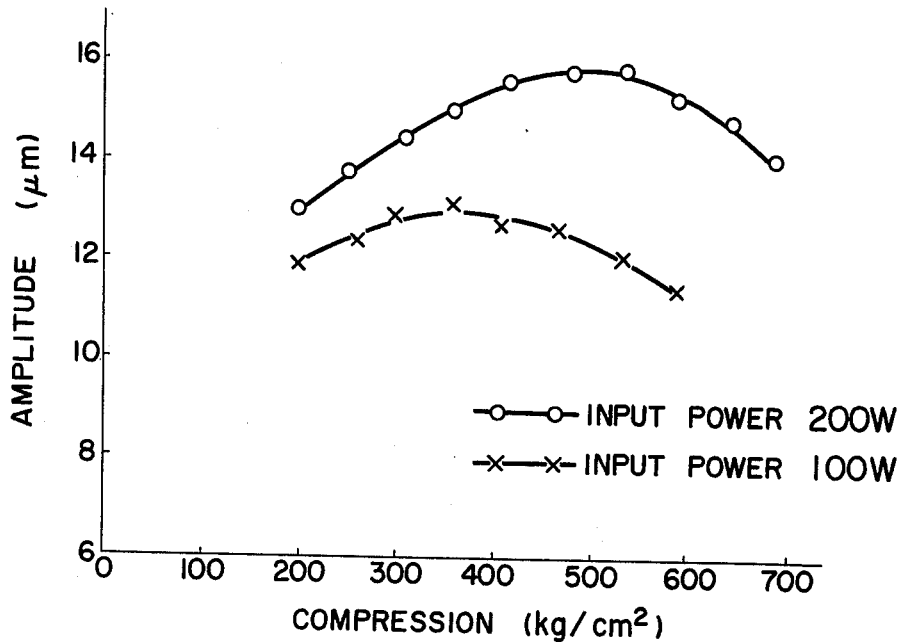
FIG. 18 is a graph showing a compressive pressure versus output amplitude characteristic of a magnetostrictive vibrator made of magnetite ferrite, which is clamped by the use of bolts and nuts.

In FIG. 18, there are indicated relations between the amplitudes of vibrations created in a magnetite $\pi$ shape magnetostrictive vibrator, as shown in FIG. 15, for use at 28 KHz, and the compressive force applied thereto, where the magnetostrictive vibrator was energized by electrical inputs of 100 W and 200W under no load condition in the air. As will be apparent from FIG. 18, even with the use of the same vibrator, the compressive force optimum for obtaining the highest amplitude of vibration of the vibrator is varied as the electrical input applied thereto is varied. As for the vibrator of this example, a compressive force of approximately 350 kg/cm$^2$ was optimum in the case of application of 100 W and that of approximately 500 kg/cm$^2$ was optimum in the case of application of 200 W. Although not shown in the drawing, it has been verified by experiments that the optimum compressive force for the case of the application of 10 W is approximately 60 kg/cm$^2$, and that for the application of 300 W is approximately 800 kg/cm$^2$. The usage of the magnetostrictive vibrator of this invention under a compressive load will now be explained with respect to a further example.

EXAMPLE 16

NA type magnetostrictive vibrators for 15 KHz made respectively of a magnetite ferrite containing 0.15 wt % of Co, 0.5 wt % of Ti, 1.2 wt % of Ca and 2 wt % of Si and of a commercially available Ni—Cu—Co ferrite were each clamped between two disks made of duralmin having a diameter of 8 cm and a thickness of 1.5 cm. The vibrators were clamped by eight stainless bolts passed through the disks in such a manner that a pressure of 1,200 kg/cm$^2$ was applied thereon in the direction of the vibration. Further, NA type magnetostrictive vibrators were prepared separately from the magnetite ferrite and Ni—Cu ferrite which had the same dimensions but were not clamped with bolts.

Operational tests for large amplitude were carried out for these four vibrators under no-load conditions in air. Each of the vibrators was provided with a winding of 25 turns around each leg thereof and, after being matched with impedance of the oscillating source, was operated with the application of an input in the most appropriate input condition therefor. The amplitudes at ultrasonic vibration of these vibrators were measured by means of a conventional optical microscope, and the results obtained were as follows.

(1) Magnetite ferrite vibrator clamped with bolts — the maximum amplitude at an input of 400 W was 28 microns; not broken.

(2) Bolt-clamped Ni—Cu—Co ferrite vibrator — did not vibrate.

(3) Not bolt-clamped magnetite ferrite vibrator — broken at an input power of 170 W, the amplitude at the breakage was 17 microns.

(4) Not bolt-clamped Ni-Cu ferrite vibrator — broken at an input power of 165 W, the amplitude at the breakage was 18 microns.

As shown in the results above, it is seen that substantially the same characteristics were obtained in the vibrators which were not bolt-clamped both for the magnetite vibrator according to the present invention and the commercial Ni—Cu—Co ferrite vibrator, but in the case of bolt-clamping, the advantage was clear for the magnetite vibrators having a positive static magnetostriction.

In bolt-clamped magnetostrictive vibrators for high outputs, magnetostrictive material having a construction of conventional $\pi$-type or NA type may be used, but for use under high outputs, it was found that vibrators having the following structural characteristics are particularly preferable to facilitate dissipation of heat.

(1) A plurality of magnetostrictive element of the magnetite ferrite structure having the shape of a pillar or plate are disposed apart from each other with each of the axes thereof arranged to the principal vibration direction of the resulting composite structure so as to form a space between each pair of adjoining magnetostrictive elements, thereby facilitate dissipation of heat generated during vibration.

(2) A plurality of biasing magnets are each sandwiched by a pair of the above-mentioned magnetostrictive element so that each magnet occupies a part of the space formed between each pair of the magnetostrictive elements, thereby to form a composite structure comprising a plurality of the magnetostrictive elements and a plurality of the biasing magnets and having a substantial unoccupied space therein.

(3) The composite structure are clamped by fixing means for applying to the composite structure a compressing force along the principal vibration direction of the composite structure thereby to impart to each end of said magnetostrictive elements a compressing force of 30 to 1,800 kg/cm$^2$.

The thus constructed composite vibrator was found to have the following advantageous features:

(a) Its mechanical strength with respect to vibration and saturated magnetostriction are both increased.

(b) It can produce a stable vibration in spite of fluctuation of load while making it possible to generate a larger amplitude of vibration.

(c) It can be mechanically secured to a supersonic apparatus through the above-mentioned fixing means.

(d) Heat dissipation under vibration is facilitated in spite of a large amplitude amplitude of vibration.

Figure 19:
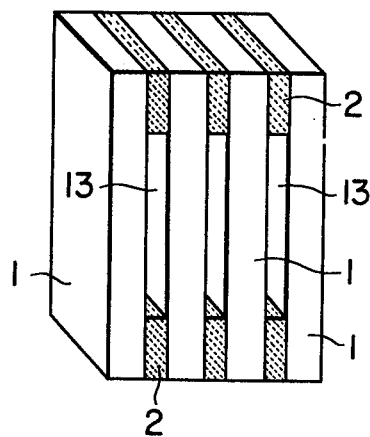
FIG. 19 is a perspective view showing a combination of planar magnetostrictive elements and bias magnets.

A vibrator having the improved construction will now be described with respect to an embodiment of the invention. In FIG. 19, there is shown, in a perspective view, an assembly formed by disposing four plate-formed magnetite magnetostrictive elements having a positive static magnetostriction in parallel with the direction of the vibration such that spaces are formed between the magnetostrictive materials 1 and by inserting biasing magnets 2 at the upper and lower end portions of the spaces in a manner such that the magnets contact the magnetostrictive materials 1.

Figure 20A:
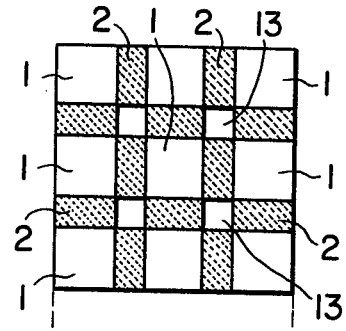
FIGS. 20a and 20b are a plan view and a side elevational view, respectively, of another combination comprising square bar-shaped magnetostrictive elements and bias magnets.
Figure 20B:
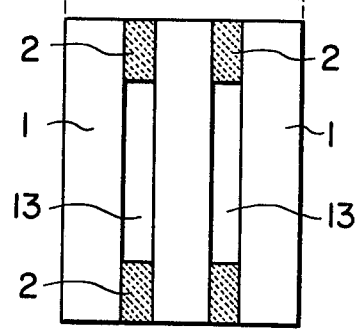

In FIG. 20, another assembly having a different form is shown in front and side views. In this case nine magnetite ferrite magnetostrictive elements 1, each in the form of a rectangular pillar, are assembled in a form of a square bar inserted with biasing magnets 2 between adjacent magnetostrictive elements 1 at the upper and lower portion of the elements in such a manner that spaces 3 are formed therebetween.

In the assemblies shown in FIGS. 19 and 20, the biasing magnets 2 are only lightly fixed near the upper and lower ends of the magnetostrictive elements 1 as shown in the drawings, and spaces are left near the central portion of the magnetostrictive elements 1. During vibration, although the central portion of a magnetostrictive element becomes a nodal point, and the generation of heat becomes maximum at this point, the dissipation of heat at this portion is greatly facilitated because of the spaces formed therearound. This excellent heat-dissipating property is very useful for improving the output limit of the supersonic ferrite vibrator. The assembly comprising a plurality of bar-formed and/or plate-formed magnetostrictive elements and biasing magnets having a construction as shown in FIGS. 19 and 20 can be used as a vibrator element, as it is, but it can be used as a more powerful supersonic vibrator when the assembly is clamped by means of a fixing means, comprising clamping plates and clamping bolts as shown in FIGS. 14 or 15 from upper and lower end surfaces in the direction of vibration so as to form a unit. Furthermore, the excellent heat dissipating property which is a characteristic of this vibrator becomes most pronounced when it is used as a high-powered supersonic vibrator.

We claim:

1. A method for generating magnetostrictive vibration which comprises:

providing a vibrator element comprising a sintered structure of magnetite having an oxygen/iron (O/Fe) atomic ratio within the range of 4.0/3 to 4.1/3, a specific resistance of not less than 0.1 ohm.cm, and a positive static magnetostriction and containing cobalt in a quantity of 0.01 to 1.0% by weight of the sintered structure; and applying an alternating magnetic field to the vibrator element.

2. The method according to claim 1 wherein said sintered structure of magnetite further contains titanium in a quantity of 0.006 to 3.0% by weight of the sintered structure.

3. The method according to claim 1 wherein said sintered structure of magnetite further contains calcium in a quantity of 0.002 to 3.0% by weight of the sintered structure.

4. A magnetostrictive vibrator which comprises:
   a magnetostrictive element of a sintered structure of magnetite having an oxygen/iron atomic ratio within the range of 4.0/3 to 4.1/3, a specific resistance of not lower than 0.1 ohm cm, and a positive magnetostriction and containing in its sintered state at least one additive element selected from the group consisting of cobalt, calcium, titanium, silicon, boron, and sodium; and
   fixing means for applying a compressing force of 30 to 1,800 kg/cm$^2$ to opposite ends of the magnetostrictive element in the direction of the principal vibration thereof.

5. The magnetostrictive vibrator according to claim 4 wherein said sintered structure of magnetite contains cobalt in a quantity of 0.01 to 1.0% by weight of the sintered structure.

6. A magnetostrictive vibrator according to claim 4 wherein said fixing means comprises a pair of fixing plates mounted on each of the two ends of the magnetostrictive element in the direction of the principal vibration thereof, and means for mechanically connecting said pair of fixing plates to each other.

7. The magnetostrictive vibrator according to claim 4 wherein said vibrator comprises:
   (1) a composite structure comprising
      (a) a plurality of magnetostrictive elements of said sintered structure having the shape of a pillar or plate and disposed apart from each other with each of the axes thereof arranged parallel to the principal vibration direction of the compositestructure thereby to form a space between each pair of adjoining magnetostrictive elements, and
      (b) a plurality of biasing magnets each of which occupies a part of said space and is sandwiched by a pair of said magnetostrictive elements,
      said composite structure thereby having a substantial unoccupied space therein; and
   (2) fixing means for applying to said composite structure a compressing force along said principal vibration direction of the composite structure thereby to impart to each end of said magnetostrictive elements a compressing force of 30 to 1,800 kg/cm$^2$.

8. A magnetostrictive vibrator according to claim 4, further comprising magnetic means for applying an alternating magnetic field and a biasing magnetic field having a strength of 5 to 50 oersted to said magnetostrictive element.

* * * * *